US007005343B2

(12) United States Patent
Yusa

(10) Patent No.: US 7,005,343 B2
(45) Date of Patent: Feb. 28, 2006

(54) SEMICONDUCTOR DEVICE AND METHOD OF MANUFACTURING THE SAME

(75) Inventor: Yoshinobu Yusa, Sakata (JP)

(73) Assignee: Seiko Epson Corporation, (JP)

(*) Notice: Subject to any disclaimer, the term of this patent is extended or adjusted under 35 U.S.C. 154(b) by 0 days.

(21) Appl. No.: 10/872,192

(22) Filed: Jun. 18, 2004

(65) Prior Publication Data

US 2005/0020025 A1  Jan. 27, 2005

(30) Foreign Application Priority Data

Jun. 20, 2003   (JP) ............................. 2003-176053

(51) Int. Cl.
*H01L 21/8242* (2006.01)
(52) U.S. Cl. .................... 438/250; 438/253; 438/396
(58) Field of Classification Search .................. 438/3, 438/238–240, 250–256, 381, 393–399
See application file for complete search history.

(56) References Cited

U.S. PATENT DOCUMENTS

2003/0011043 A1 * 1/2003 Roberts ................. 257/532

FOREIGN PATENT DOCUMENTS

| JP | 10-004086   | 1/1998  |
| JP | 11-289049   | 10/1999 |
| JP | 2001-024157 | 1/2001  |
| JP | 2002-026020 | 1/2002  |
| JP | 2002-280528 | 9/2002  |
| JP | 2003-158190 | 5/2003  |

* cited by examiner

*Primary Examiner*—H. Jey Tsai
(74) *Attorney, Agent, or Firm*—Harness, Dickey & Pierce, P.L.C.

(57) ABSTRACT

A semiconductor device including an MIM capacitor is provided. A first metal wiring layer is patterned together with a first hard mask member and forms a lower capacitor electrode. A second metal wiring layer is formed on the first metal wiring layer with a capacitor insulating film therebetween and is patterned together with a protection layer and a second hard mask member which remains under the first hard mask member. The second metal wiring layer forms a plurality of upper capacitor electrodes. A third metal wiring layer connected with the first or second metal wiring layer is patterned on an insulating film. The third metal wiring layer includes a connection with a plug wiring member provided within a first or second contact hole.

5 Claims, 4 Drawing Sheets

SEMICONDUCTOR DEVICE AND METHOD OF MANUFACTURING THE SAME

RELATED APPLICATIONS

This application claims priority to Japanese Patent Application No. 2003-176053 filed Jun. 20, 2003 which is hereby expressly incorporated by reference herein in its entirety.

BACKGROUND

1. Field of the Invention

The present invention relates to a method of manufacturing a semiconductor device and a semiconductor device, and more particularly, the invention relates to a semiconductor device including a capacitor having a metal-insulator-metal (MIM) structure in a metal multilayer wiring which forms an integrated circuit and a method of manufacturing such a semiconductor device.

2. Description of the Related Art

An MIM capacitor to which a metal multilayer wiring technology is applied has lower parasitic resistance and parasitic capacitance compared to capacitors which have a metal-oxide semiconductor (MOS) structure or electrodes made of polysilicon. Therefore, using such an MIM capacitor may improve the performance of devices. Though not shown in the figures, an example of such an MIM capacitor is described. A metal wiring layer A is formed on an interlayer insulating film in a semiconductor integrated circuit, and a predetermined region of the metal wiring layer A is made as a first capacitor electrode. A specific metal pattern serving as a second capacitor electrode is provided on the metal wiring layer A with a capacitor insulating film therebetween. In this case, the metal wiring layer B provided in an upper layer with the insulating film therebetween leads out an extraction electrode of the capacitor as well as other wiring circuits, for example, through a via opening with plug wirings.

The structure described above involves the following problems when the via opening which reaches the metal wiring layer A serving as the first capacitor electrode and the via opening which reaches the specific metal pattern serving as the second capacitor electrode are formed simultaneously. When these via openings are formed at the same time, the specific metal pattern as the second capacitor electrode placed over the metal wiring layer A is exposed prior to the metal wiring layer A. Therefore, the specific metal pattern can be over-etched before the via opening reaches the metal wiring layer A. To prevent the metal pattern from being over-etched, a nitride layer serving as an etching stopper can be formed on the specific metal pattern as the second capacitor electrode. However, when the specific metal pattern is being etched, a sidewall polymer is produced since a resist contacts with the nitride layer. The sidewall polymer is difficult to remove even by cleaning and it can cause contamination in the next process.

The present invention has been developed in consideration of the problems mentioned above, and intended to provide a semiconductor device including an MIM capacitor which has efficient and stable wiring connections in a multilayer wiring and a method of manufacturing the same.

SUMMARY

A method of manufacturing a semiconductor device of the present invention includes a step of forming a first metal wiring layer including at least a first capacitor electrode on a predetermined layer included in a semiconductor integrated circuit, a step of coating the first capacitor electrode with a capacitor insulating film, and a step of forming a second metal wiring layer serving as a second capacitor electrode on the capacitor insulating film. The method also includes a step of forming a protection film on the second metal wiring layer, a step of forming a first hard mask member on the protection film, a step of forming a mask pattern of the second capacitor electrode on the first hard mask member, and a step of removing the first hard mask member, the protection film and the second metal wiring layer selectively according to the mask pattern of the second capacitor electrode. The method also includes a step of forming a second hard mask member to cover at least the first hard mask member, a step of forming a mask pattern of the first capacitor electrode covering the second hard mask member, a step of removing at least the second hard mask member, the capacitor insulating film and the first metal wiring layer selectively according to the mask pattern of the first capacitor electrode, a step of forming an interlayer insulating film overall to cover at least the second hard mask member, and a step of forming a plurality of contact holes reaching at least one of the first metal wiring layer and the second metal wiring layer in the interlayer insulating film.

According to the above-described method of manufacturing a semiconductor device, as well as the protection film, the first hard mask member and the second hard mask member are formed on the second capacitor electrode. This structure contributes to prevention of a decrease in the thickness of the insulating film disposed on the second capacitor electrode. Moreover, the mask pattern of the second capacitor electrode is formed on the first hard mask member. Therefore, the second capacitor electrode is well controlled while being processed and a sidewall polymer will be prevented from being made, since the mask pattern does not directly contact the protection film. The protection film formed on the second capacitor electrode makes it possible to securely form contact holes which have different depths simultaneously.

In the method of manufacturing a semiconductor device, a step of forming a plug wiring member provided within each of the contact holes and a step of patterning another metal wiring layer to be connected with each plug wiring member may be also included. This makes it possible to efficiently form a wiring through a deep contact hole.

In the method of manufacturing a semiconductor device, at least one of the following features may be included: at least the interlayer insulating film being planarized, the protection film serving as an etching stopper at least while forming the contact holes, and the first hard mask member and the second hard mask member being formed of a same insulating material. These features contribute to an efficient formation of the contact holes.

A semiconductor device of the present invention includes a first capacitor electrode including a first metal wiring layer formed on a predetermined layer included in a semiconductor integrated circuit, a capacitor insulating film formed on the first capacitor electrode, a second capacitor electrode provided in the plural number including a second metal wiring layer formed on the capacitor insulating film, a protection film formed on the second capacitor electrode, an interlayer insulating film covering the first metal wiring layer and the second metal wiring layer with a predetermined thickness, and a predetermined wiring pattern formed on the interlayer insulating film and connected with the first metal wiring layer or the second metal wiring layer. The interlayer insulating film includes a first hard mask member pattern for forming the second capacitor electrode provided on the second capacitor electrode, and a second hard mask member pattern for forming the first capacitor electrode provided on the first hard mask member pattern and the first capacitor electrode.

According to the above-described semiconductor device, the protection film formed on the second capacitor electrode, the first hard mask member pattern and the second hard mask member pattern prevents a decrease in the thickness of layers formed on the second capacitor electrode. Moreover, the contact holes which have different depths are stably provided by disposing the protection film formed on the second capacitor electrode, even when these holes are formed simultaneously.

In the semiconductor device, a plug wiring member provided within each contact hole reaching the first metal wiring layer or the second metal wiring layer may be provided, and the wiring pattern may be another metal wiring layer connected with each plug wiring member. This makes it possible to efficiently form a wiring structure through a deep contact hole. Also, in the semiconductor device, the first hard mask member pattern and the second hard mask member pattern may be formed of a same insulating material. This makes it possible to provide reliable contact holes and associated contact portions.

DETAILED DESCRIPTION

Figure 1:
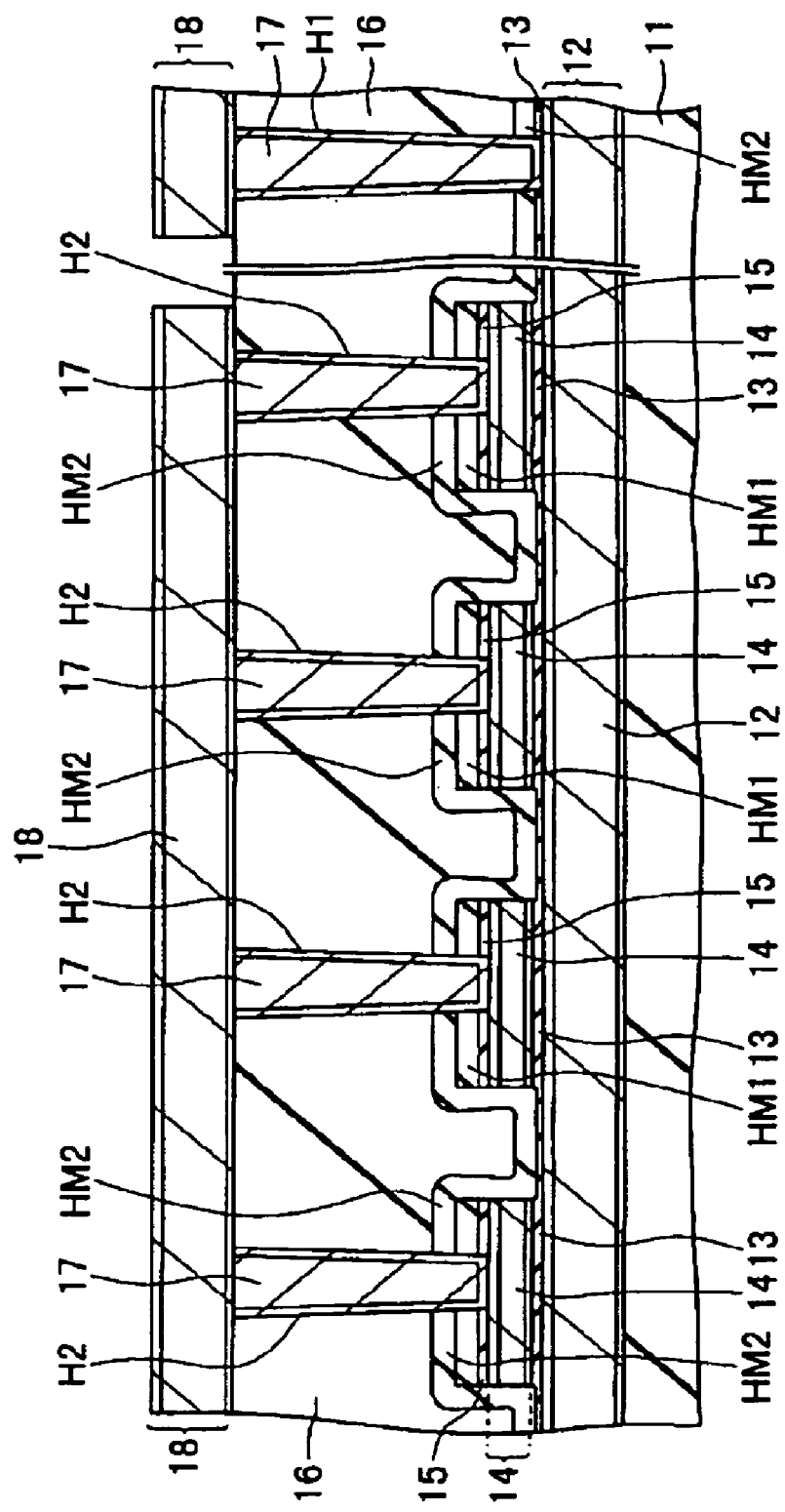
FIG. 1 is a sectional view showing a structure of an MIM capacitor according to a first embodiment of the present invention.

FIG. 1 is a sectional view showing the structure of an MIM capacitor included in a semiconductor integrated circuit according to a semiconductor device of a first embodiment of the present invention. The integrated circuit having a metal multilayer wiring technology is constructed on a semiconductor substrate. In a part of the integrated circuit, a metal wiring layer 12 is formed on an insulating film 11 in a predetermined layer. The metal wiring layer 12 may be formed of a multilayer of, for example, TiN/Al—Cu alloy/Ti/TiN. The metal wiring layer 12 is patterned together with a hard mask member HM2. In this embodiment the hard mask member HM2 is formed of a SiO-based material and it remains here. The metal wiring layer 12 here forms a plate of a lower capacitor electrode. In other regions, the metal wiring layer 12 forms a usual wiring pattern, a dummy pattern and the like.

A metal wiring layer 14 is formed on the metal wiring layer 12 with a capacitor insulating film 13 therebetween. Provided on the metal wiring layer 14 is a protection film 15. The capacitor insulating film 13 is formed of a SiN film, for example. The metal wiring layer 14 is formed of a multilayer of, for example, TiN/Al—Cu alloy/TiN. The protection film 15 is formed of a SiN film, for example. The metal wiring layer 14 is patterned together with the protection film 15 and a hard mask member HM1 which remains under the hard mask member HM2. The hard mask member HM1 here is formed of a SiO-based material. The metal wiring layer 14 forms more than one plate of an upper capacitor electrode.

An insulating film 16 is an interlayer insulating film having a predetermined thickness and covers the metal wiring layer 12 and the metal wiring layer 14. Patterned on the insulating film 16 is a next metal wiring layer 18 connects with the metal wiring layer 12 or the metal wiring layer 14. The metal wiring layer 18 is formed of a multilayer of metal like the metal wiring layer 12 placed below the metal wiring layer 18. The metal wiring layer 18 includes a wiring pattern connected with a plug wiring member 17 provided within a contact hole H1 reaching the metal wiring layer 12 or a contact hole H2 reaching the metal wiring layer 14. The plug wiring member 17 has a double-plug structure in which the contact hole H1 and the contact hole H2 are covered with a barrier of metal, such as a TiN film or a TaN film.

The metal wiring layers 12, 14 and 18 in the present embodiment are not particularly limited to the metal layers described above. The capacitor insulating film 13 may be formed of any insulating film other than a SiN film. The protection film 15 may also be formed of any insulating film other than a SiN film, though its selective etching ratio to the insulating film 16 has to be large enough for working as an etching stopper, considering forming the contact hole H1 and the contact hole H2 at the same time. Also, the plug wiring member 17 is not particularly limited to the structure described above, and it may be formed of polysilicon. When the metal wiring layer 18 excels in embedding and step coating, the plug wiring member 17 may be omitted. The hard mask members HM1 and HM2 may be formed of different materials. Concerning forming processes, formation of the contact holes H1 and H2 and reliability of these connecting portions, it may be favorable that the hard mask members HM1 and HM2 are formed of a same material.

According to the present embodiment described above, the protection film 15 formed on the metal wiring layer 14, namely the upper capacitor electrode, and the hard mask members HM1 and HM 2 realize prevention of a decrease in the thickness of the upper capacitor electrode. Also, the contact hole H1 and the contact hole H2, which have different depths, are stably provided by disposing the protection film 15 on the upper capacitor electrode, even when these holes are formed simultaneously. Moreover, the hard mask member HM1 allows the upper capacitor electrode (the metal wiring layer 14) to be well controlled while being processed, and prevents a sidewall polymer from being made. With the structure described above, a method for manufacturing a capacitor will now be described.

FIG. 2 through 6 are sectional views showing a method of manufacturing a semiconductor device according to a second embodiment of the present invention. They show steps for manufacturing an MIM capacitor included in a semiconductor integrated circuit in due order. The same structures as those of the first embodiment are given identical reference numerals.

Figure 2:
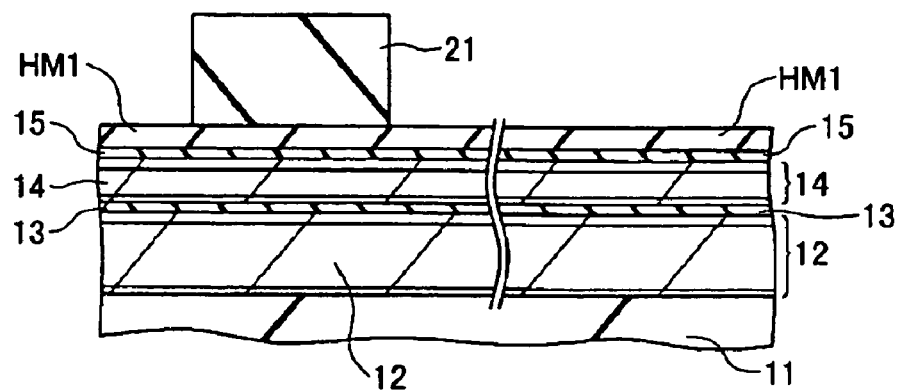
FIG. 2 is a first sectional view of a step for manufacturing an MIM capacitor according to a second embodiment of the present invention.

In a part of the integrated circuit, the metal wiring layer 12 is formed on the insulating film 11 in a predetermined layer as shown in FIG. 2. The metal wiring layer 12 is formed of a multilayer of TiN/Al—Cu alloy/Ti/TiN, for example, by a sputtering method. In this embodiment, each layer of TiN, the alloy of Al—Cu, Ti, and TiN has a thickness of approximately 30 nm, 500 nm, 20 nm, and 60 nm, respectively. The capacitor insulating film 13 is formed on the metal wiring layer 12. The capacitor insulating film 13 is a SiN film, whose thickness is approximately 60 nm, and formed by a chemical vapor deposition (CVD) process in an atmosphere of plasma excitation (hereinafter called a "PESiN [Plasma Enhanced SiN] film").

Then, the metal wiring layer 14 is formed on the capacitor insulating film 13. The metal wiring layer 14 is formed of a multilayer of TiN/Al—Cu alloy/TiN, for example, by a sputtering method. In this embodiment, each layer of TiN, Al—Cu alloy, and TiN has a thickness of approximately 30 nm, 200 nm, and 60 nm, respectively. Then, the protection film 15 is formed on the metal wiring layer 14. The protection film 15 is provided as an etching stopper of the metal wiring layer 14. The protection film 15 is formed by making a PESiN film of 60 nm thick by the CVD process. Then, the hard mask member HM1 is formed on the protection film 15. The hard mask member HM1 is formed of a SiO-based material, for example, to give an actual example, which is a $SiO_2$ film of 100 nm thick, by the CVD process. Then, a resist pattern (a mask pattern) 21 of an upper capacitor electrode CP2 is formed after a photolithography process.

Figure 3:
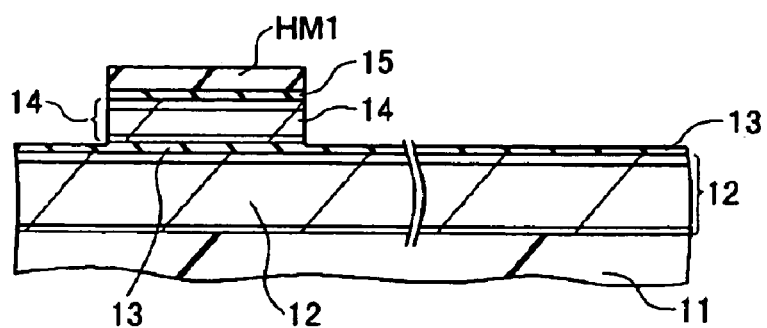
FIG. 3 is a second sectional view showing a step following the one shown in FIG. 2.

Then, as shown in FIG. 3, unnecessary parts of the hard mask member HM1, the protection film 15 and the metal wiring layer 14 are removed in due order by an anisotropic etching using the resist pattern 21 as a mask. The etching is stopped at a level of the capacitor insulating film 13 working as an etching stopper. The upper capacitor electrode CP2 is formed in this manner. Since the hard mask member HM1 is disposed between the resist pattern 21 made of a resin-based material and the protection film 15 made of a nitride film, a sidewall polymer of the metal wiring layer 14 will be hardly made.

Figure 4:
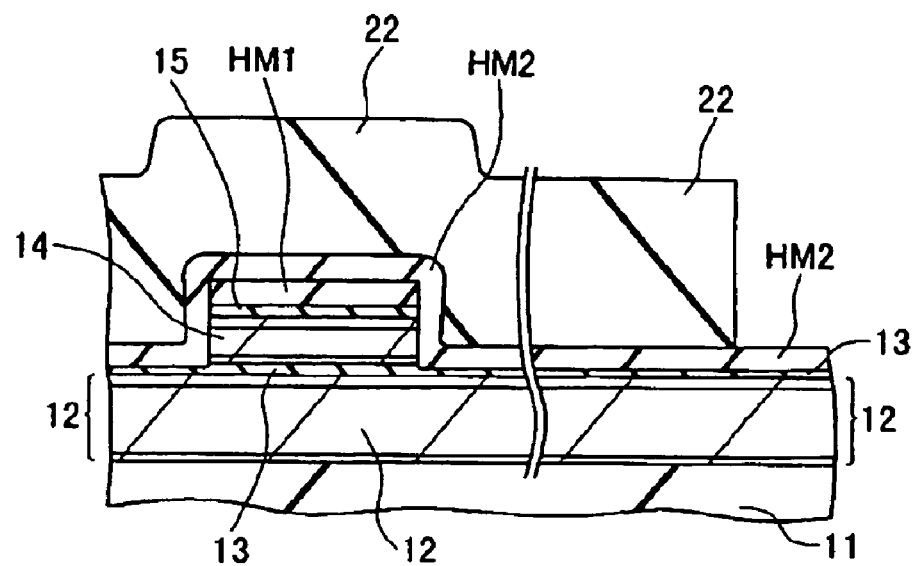
FIG. 4 is a third sectional view showing a step following the one shown in FIG. 3.

Then, the hard mask member HM2 is formed to cover the whole surface of the hard mask member HM1 as shown in FIG. 4. The hard mask member HM2 is also made of a SiO-based material, to give an actual example, which is a $SiO_2$ film of 100 nm thick, by the CVD process, in the same way as the hard mask member HM1. Then, a resist pattern (a mask pattern) 22 of a lower capacitor electrode CP1 is formed after a photolithography process. The resist pattern 22 covers at least the hard mask member HM2. In other regions, the resist pattern 22 forms patterns to form a usual wiring pattern, a dummy pattern and the like.

Figure 5:
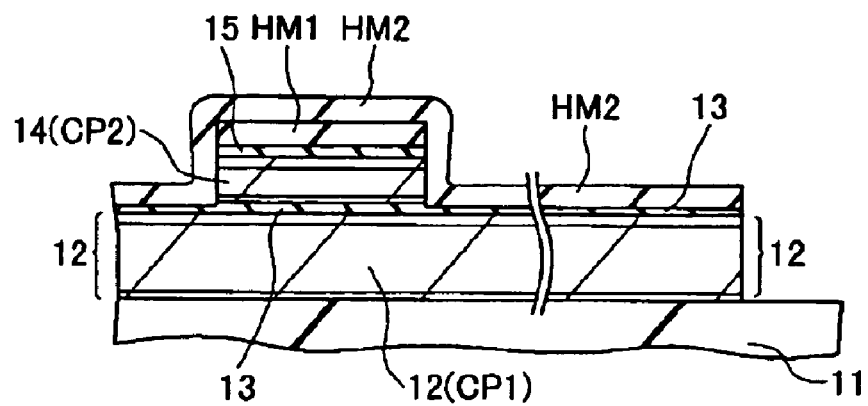
FIG. 5 is a fourth sectional view showing a step following the one shown in FIG. 4.

Then, as shown in FIG. 5, unnecessary parts of the hard mask member HM2, the capacitor insulating film 13 and the metal wiring layer 12 are removed in due order by an anisotropic etching using the resist pattern 22 as a mask. Subsequently, the resist pattern 22 is removed, and then the MIM capacitor, which is composed of the lower capacitor electrode CP1, the capacitor insulating film 13 and the upper capacitor electrode CP2, appears.

Figure 6:
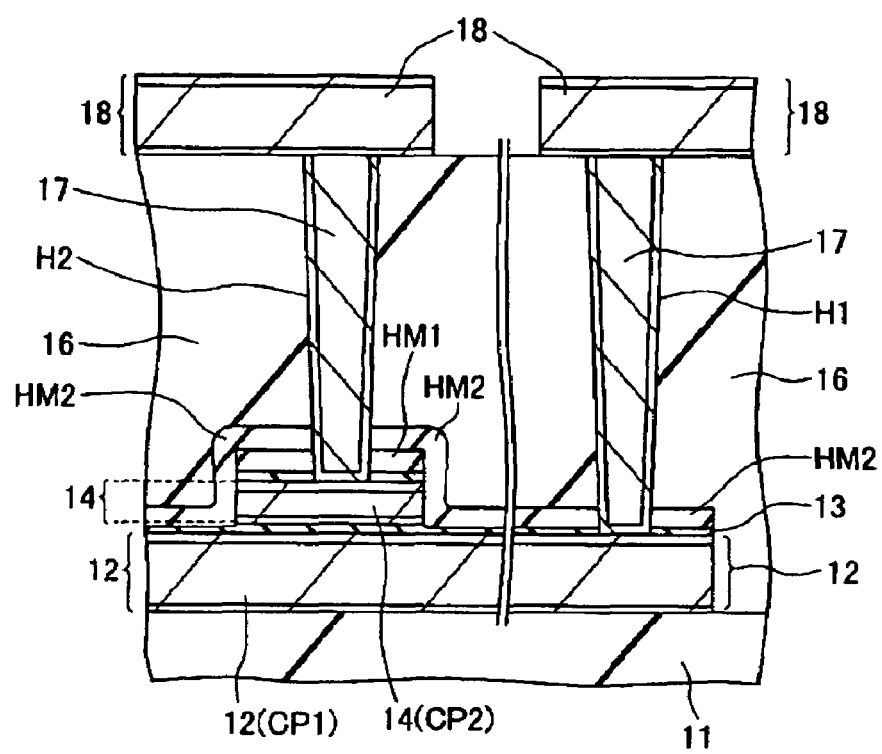
FIG. 6 is a fifth sectional view showing a step following the one shown in FIG. 5.

Then, as shown in FIG. 6, the insulating film 16 between layers having a predetermined thickness is formed on the hard mask member HM1, to cover the metal wiring layer 12 and the metal wiring layer 14. Then, the contact hole H1 which reaches the metal wiring layer 12 and the contact hole H2 which reaches the metal wiring layer 14 are formed in the insulating film 16 by a photolithography process and an anisotropic etching process. The contact hole H1 and the contact hole H2 which have different depths are formed simultaneously. Though the contact hole H2 is shallower than the contact hole H1 and reaches the protection film 15 fast, the protection film 15 works as an etching stopper. In other words, the protection film 15 protects the metal wiring layer 12 until the contact hole H1, which is deeper than the contact hole H2, reaches the capacitor insulating film 13.

After that, a part of the capacitor insulating film 13 and the protection film 15 under the contact holes H1 and H2 are etched simultaneously. Thus the contact holes H1 and H2, which have different depths, are formed simultaneously.

Then, after the inside of each of the contact holes H1 and H2 is coated with a barrier of metal such as a TiN film and a TaN film by sputtering, a Wis formed by CVD (Chemical Vapor Deposition) technology. The plug wiring member 17 is formed after the double-plug is planarized by a CMP (Chemical Mechanical Polishing) process. Then, a multilayer of TiN/Al—Cu alloy/Ti/TiN is formed by a sputtering process, and another metal wiring layer 18 is patterned by a photolithography process and an anisotropic etching process. The metal wiring layer 18 includes a wiring pattern connected with the plug wiring member 17 provided within the contact hole H1 reaching the metal wiring layer 12 or the contact hole H2 reaching the metal wiring layer 14.

According to the present embodiment, besides the protection film 15, the hard mask member HM1 and the hard mask member HM2 are formed on the upper capacitor electrode CP2. This structure contributes to prevention of a decrease in the thickness of an insulating film disposed on the upper capacitor electrode CP2, even when a planarizing process of CMP is performed. Moreover, the resist pattern 21 of the metal wiring layer 14 that is the upper capacitor electrode is formed on the hard mask member HM1. Therefore, the upper capacitor electrode is well controlled while being processed, and a sidewall polymer will be prevented from being made, since the resist pattern 21 made of a resin-based material and the protection film 15 made of a nitride film do not directly contact each other. Moreover, the protection film 15 and the capacitor insulating film 13 serving as an etching stopper make it possible to securely form contact holes which have different depths simultaneously.

In the present embodiment of the manufacturing method, the metal wiring layers 12, 14 and 18 are not particularly limited to the metal multilayers described above. Each thickness of the multilayers is just an example and can be suitably changed. The hard mask members HM1 and HM2 can also be changed to other materials such as a SiOC-based material. The capacitor insulating film 13 and the protection film 15 can be suitably changed into other films as long as they work as etching stopper films. Also, a structure of the plug wiring member 17 is not particularly limited to this embodiment and can be changed.

According to the embodiments and methods described above, the etching stopper function is used when an etching process in which different depth contact holes are simultaneously formed is performed. Therefore, stress from over-etching is far reduced, and thereby preventing the contact holes from going through a metal pattern of the upper capacitor electrode or the capacitor insulating film. Also, a hard mask is interposed to avoid contacting a layer which has the etching stopper function and a resist pattern. Therefore, a polymer is hardly made on an etched sidewall. It helps to prevent a production line from being contaminated and a characteristic of an element from being lowered. Moreover, when each capacitor electrode is formed, the insulating film on the upper capacitor electrode tends to be prevented from lessening its thickness. Consequently, a semiconductor device including an MIM capacitor which has efficient and stable wiring connections in a metal multilayer wiring and a method of manufacturing the same are provided.

What is claimed is:

1. A method of manufacturing a semiconductor device, comprising:

forming a first metal wiring layer including at least a first capacitor electrode on a predetermined layer included in a semiconductor integrated circuit;

coating the first capacitor electrode with a capacitor insulating film;

forming a second metal wiring layer serving as a second capacitor electrode on the capacitor insulating film;

forming a protection film on the second metal wiring layer;

forming a first hard mask member on the protection film;

forming a mask pattern of the second capacitor electrode on the first hard mask member;

selectively removing the first hard mask member, the protection film and the second metal wiring layer according to the mask pattern of the second capacitor electrode;

forming a second hard mask member to cover at least the first hard mask member;

forming a mask pattern of the first capacitor electrode covering the second hard mask member;

selectively removing at least the second hard mask member, the capacitor insulating film and the first metal wiring layer according to the mask pattern of the first capacitor electrode;

forming an interlayer insulating film to cover at least the second hard mask member; and forming a plurality of contact holes reaching at least one of the first metal wiring layer and the second metal wiring layer in the interlayer insulating film.

2. The method of manufacturing a semiconductor device according to claim 1, further comprising:

forming a plug wiring member within each of the contact holes; and patterning another metal wiring layer to be connected with each plug wiring member.

3. The method of manufacturing a semiconductor device according to claim 1, wherein at least the interlayer insulating film is planarized.

4. The method of manufacturing a semiconductor device according to claim 1, wherein the protection film serves as an etching stopper at least while forming the contact holes.

5. The method of manufacturing a semiconductor device according to claim 1, wherein the first hard mask member and the second hard mask member comprise the same insulating material.

* * * * *